United States Patent
Natori et al.

(10) Patent No.: US 9,196,335 B2
(45) Date of Patent: Nov. 24, 2015

(54) MAGNETIC MEMORY

(71) Applicant: KABUSHIKI KAISHA TOSHIBA, Tokyo (JP)

(72) Inventors: Katsuaki Natori, Yokohama (JP); Koji Yamakawa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 135 days.

(21) Appl. No.: 13/962,913

(22) Filed: Aug. 8, 2013

(65) Prior Publication Data

US 2014/0269033 A1    Sep. 18, 2014

Related U.S. Application Data

(60) Provisional application No. 61/785,514, filed on Mar. 14, 2013.

(51) Int. Cl.
| | |
|---|---|
| *G11C 11/16* | (2006.01) |
| *H01L 43/08* | (2006.01) |
| *B82Y 25/00* | (2011.01) |

(52) U.S. Cl.
CPC ............... *G11C 11/161* (2013.01); *H01L 43/08* (2013.01); *B82Y 25/00* (2013.01)

(58) Field of Classification Search
CPC ......... G11C 11/16; G11C 11/15; H01L 43/08
See application file for complete search history.

(56) References Cited

U.S. PATENT DOCUMENTS

| | | | | |
|---|---|---|---|---|
| 2010/0176472 | A1* | 7/2010 | Shoji | 257/421 |
| 2012/0075922 | A1* | 3/2012 | Yamada et al. | 365/158 |
| 2012/0217594 | A1* | 8/2012 | Kajiyama | 257/421 |
| 2012/0250398 | A1 | 10/2012 | Morise et al. | |
| 2012/0250406 | A1 | 10/2012 | Morise et al. | |
| 2013/0250661 | A1* | 9/2013 | Sandhu et al. | 365/158 |
| 2014/0169061 | A1* | 6/2014 | Bibes et al. | 365/145 |

FOREIGN PATENT DOCUMENTS

| | | |
|---|---|---|
| JP | 2006-286713 A | 10/2006 |
| JP | 2012-009786 A | 1/2012 |
| JP | 2012-119565 A | 6/2012 |

* cited by examiner

*Primary Examiner* — Richard Elms
*Assistant Examiner* — Ajay Ojha
(74) *Attorney, Agent, or Firm* — Holtz, Holtz, Goodman & Chick PC

(57) ABSTRACT

According to one embodiment, a magnetic memory includes magnetoresistive effect elements each including a first magnetic layer, a tunnel barrier layer, and a second magnetic layer which are successively stacked, and a ferroelectric capacitor provided above the magnetoresistive effect elements via an insulating layer, and including a lower electrode, a ferroelectric film, and an upper electrode which are successively stacked.

21 Claims, 9 Drawing Sheets

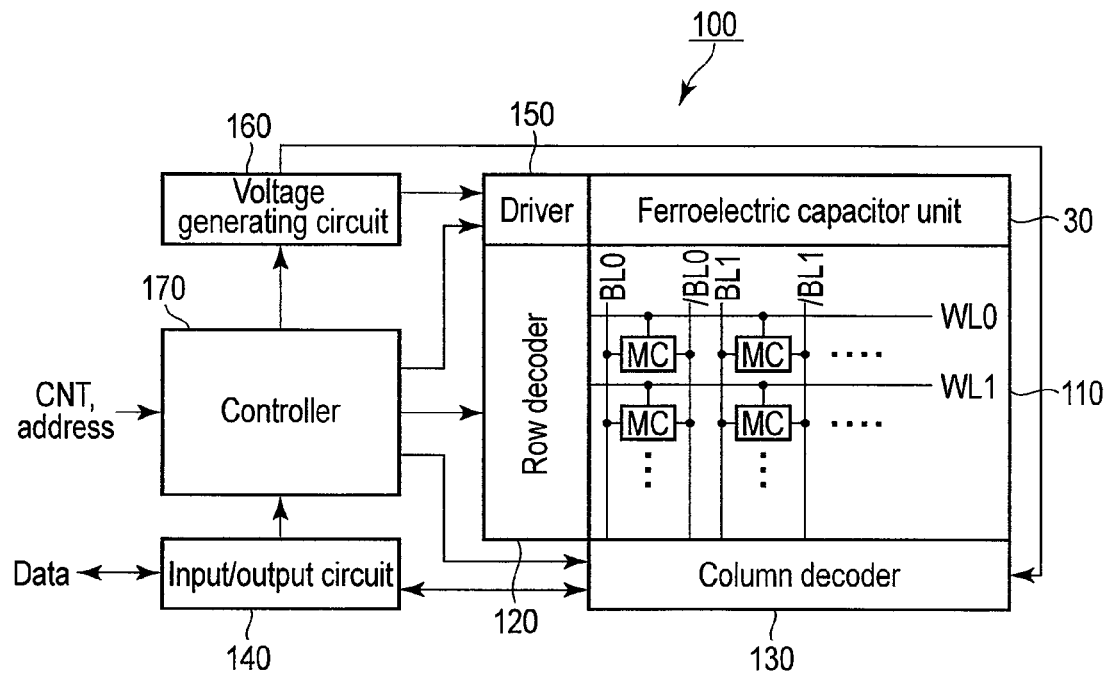
F I G. 1
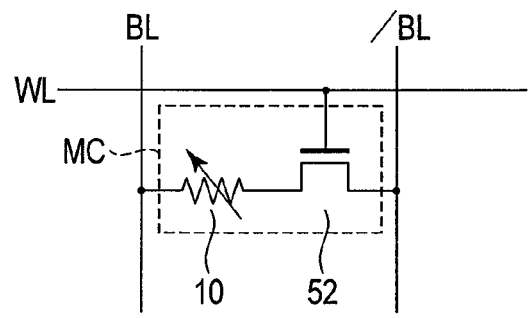
F I G. 2

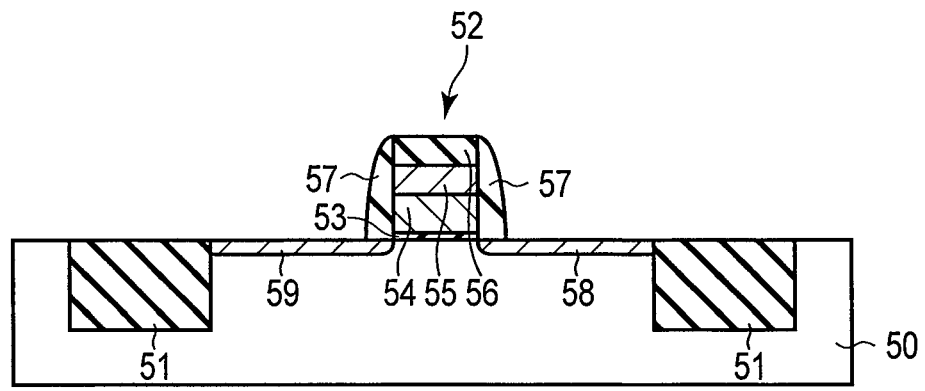
F I G. 6
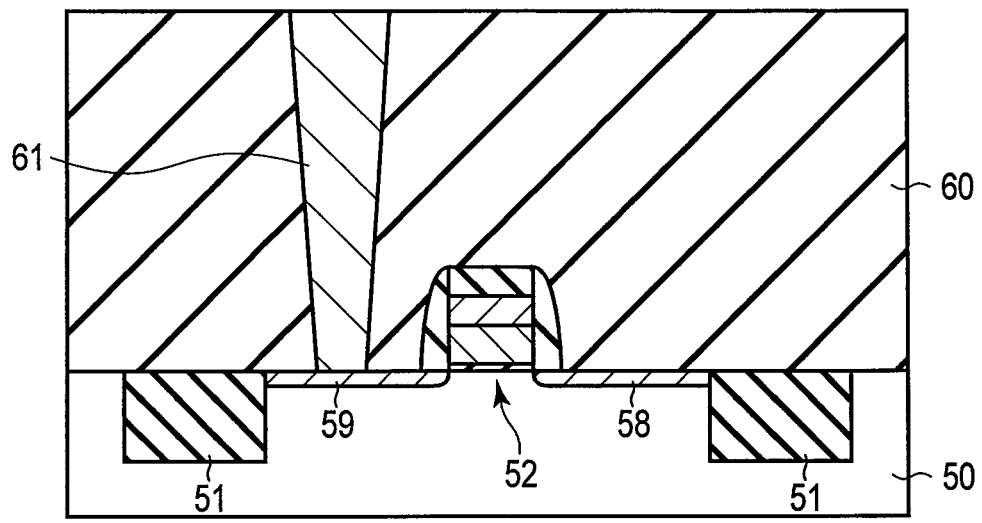
F I G. 7

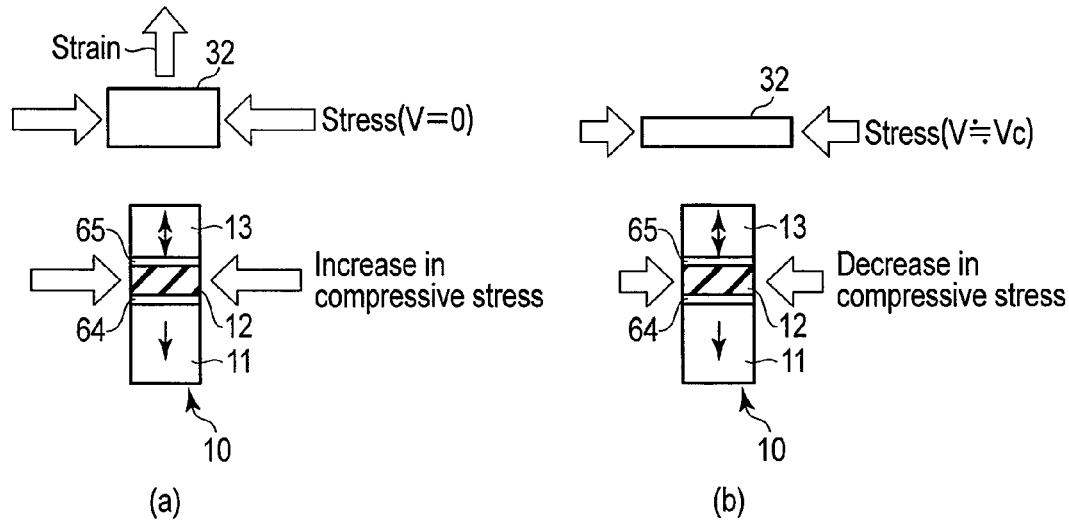
F I G. 11
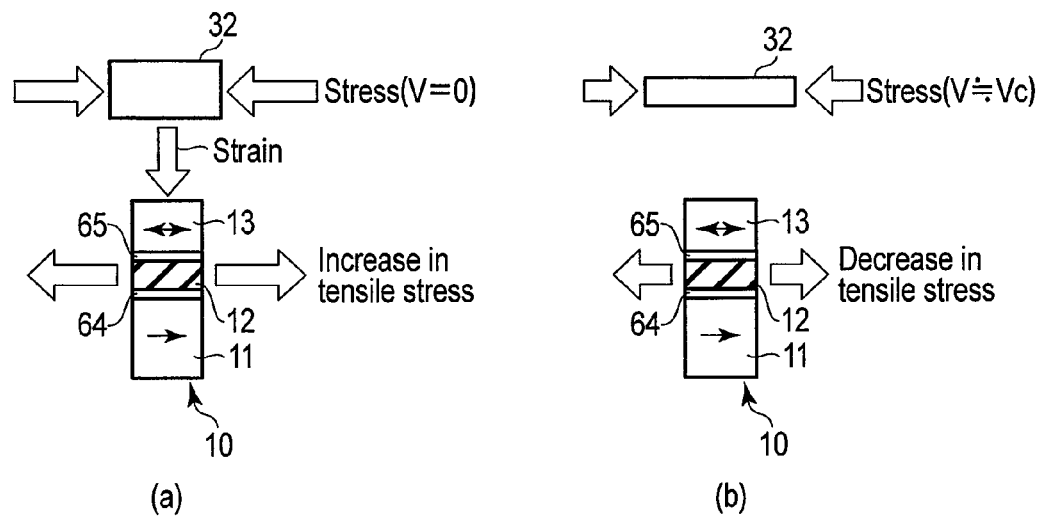
F I G. 12

MAGNETIC MEMORY

CROSS-REFERENCE TO RELATED APPLICATIONS

This application claims the benefit of U.S. Provisional Application No. 61/785,514, filed Mar. 14, 2013, the entire contents of which are incorporated herein by reference.

FIELD

Embodiments described herein relate generally to a magnetic memory.

BACKGROUND

In recent years, there has been proposed a magnetoresistive random access memory (MRAM) which makes use of a tunneling magnetoresistive effect. The MRAM has a feature in that data is stored by a magnetization configuration of an MTJ (Magnetic Tunnel Junction) element. As a method of changing the magnetization configuration, there is known a method of using a magnetic field which is generated by an electric current flowing in wiring, or a method of using a spin-polarized current. In the former method, since it is necessary to dispose the wiring, which generates the magnetic field, near the MTJ element, there is a problem that integration is difficult. On the other hand, the latter method has a feature that integration is easy, since a memory cell is basically composed of a select transistor and an MTJ element, like a DRAM.

The MTJ element includes a reference layer having a fixed direction of magnetization, a memory layer in which the direction of magnetization is changed by a spin-polarized current, and a tunnel barrier layer disposed between the reference layer and the memory layer. The value of an electric current, which passes through the tunnel barrier layer, varies depending on whether the direction of magnetization of the memory layer and that of the reference layer are identical or opposite. Based on this variation in resistance, data 1 and data 0 are discriminated. Rewrite of data is executed by causing a current to flow through the tunnel barrier layer, thereby transferring spin polarization of the reference layer to the memory layer. As the reversion of magnetization of the memory layer is easier (i.e. as the magnetic anisotropy is smaller), the direction of magnetization of the memory layer can be changed by a smaller current. Accordingly, a current, which flows through a select transistor that is connected in series to the MTJ element, can be decreased, and microfabrication of elements can advantageously be achieved. Meanwhile, if the magnetic anisotropy of the memory layer is decreased, such a problem arises that the direction of magnetization is reversed by thermal agitation and the data retention characteristic deteriorates.

BRIEF DESCRIPTION OF THE DRAWINGS

FIG. 1 is a block diagram of an MRAM according to a first embodiment;

FIG. 2 is a circuit diagram of one memory cell;

FIG. 6 is a cross-sectional view illustrating a manufacturing step of the MRAM;

FIG. 7 is a cross-sectional view illustrating a manufacturing step of the MRAM;

FIG. 11 is a schematic view illustrating a relationship between a stress, which is applied to an MTJ element, and characteristics of the MTJ element;

FIG. 12 is a schematic view illustrating a relationship between a stress, which is applied to an MTJ element according to a second embodiment, and characteristics of the MTJ element;

DETAILED DESCRIPTION

Figure 3:
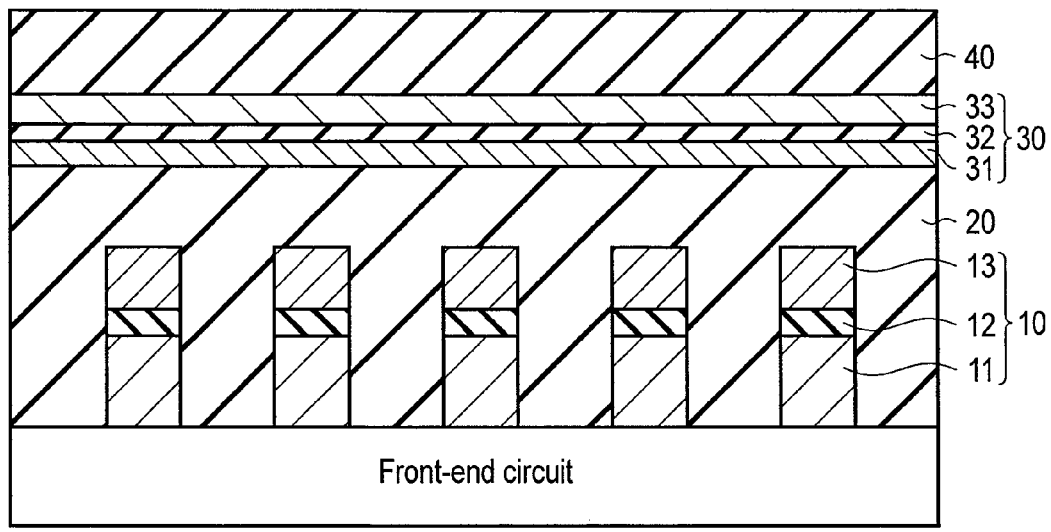
FIG. 3 is a schematic cross-sectional view of a memory cell array and a ferroelectric capacitor unit.

In general, according to one embodiment, there is provided a magnetic memory comprising:

magnetoresistive effect elements each including a first magnetic layer, a tunnel barrier layer, and a second magnetic layer which are successively stacked; and a ferroelectric capacitor provided above the magnetoresistive effect elements via an insulating layer, and including a lower electrode, a ferroelectric film, and an upper electrode which are successively stacked.

Various embodiments will be described hereinafter with reference to the accompanying drawings. In the description below, elements having the same function and structure are denoted by like reference numerals, and an overlapping description will be given only where necessary.

First Embodiment

[1. Entire Structure of MRAM]

FIG. 1 is a block diagram of an MRAM (magnetic memory) 100 according to a first embodiment. The MRAM 100 includes a memory cell array 110, a row decoder 120, a column control circuit 130, an input/output circuit 140, a driver (driving circuit) 150, a voltage generating circuit 160, a controller 170, and a ferroelectric capacitor unit 30.

The memory cell array 110 is configured such that a plurality of memory cells MC are arranged in a matrix. In the memory cell array 110, a plurality of bit line pairs BL and /BL, and a plurality of word lines WL are provided.

FIG. 2 is a circuit diagram of one memory cell MC. The memory cell MC includes a magnetoresistive effect element (MTJ (Magnetic Tunnel Junction) element) 10, and a select transistor 52. An n-channel MOSFET, for example, is used as the select transistor 52. One end of the MTJ element 10 is connected to the bit line BL, and the other end of the MTJ element 10 is connected to the drain of the select transistor 52. The gate of the select transistor 52 is connected to the word line WL, and the source of the select transistor 52 is connected to the bit line /BL.

The row decoder 120 is connected to the word lines WL. The row decoder 120 selects one of the word lines WL, based on a row address.

The column control circuit 130 is connected to the bit line pairs BL and /BL. At a time of data read, the column control circuit 130 selects, based on a column address, one of the bit line pairs, and reads data from the selected bit line pair. In addition, at a time of data write, the column control circuit 130 writes data to a selected memory cell, by supplying a write current to the selected memory cell via the selected bit line pair. In order to execute these operations, the column control circuit 130 includes a column decoder, a column select circuit, a sense amplifier and a write driver.

The input/output circuit 140 sends input data, which is input from the outside, to the column control circuit 130 as write data, and outputs read data, which is input from the column control circuit 130, to the outside as output data.

The ferroelectric capacitor unit 30 includes one or plural ferroelectric capacitors. The ferroelectric capacitor unit 30 has a function of applying a stress to the MTJ element 10. The concrete operation of the ferroelectric capacitor unit 30 will be described later.

The driver 150 drives the ferroelectric capacitor unit 30 by using a voltage which is received from the voltage generating circuit 160. The voltage generating circuit 160 generates various voltages and supplies necessary voltages to the column control circuit 130 and driver 150.

The controller 170 executes overall control of various operations of the MRAM 100. For example, the controller 170 receives control signals CNT and addresses from the outside, and controls a write operation and a read operation, based on these signals.

[2. Structure of MRAM]

Figure 4:
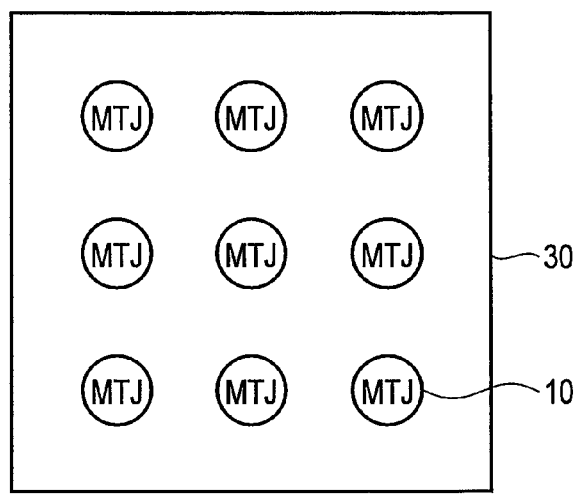
FIG. 4 is a layout view of the MRAM.

FIG. 3 is a schematic cross-sectional view of the memory cell array 110 and ferroelectric capacitor unit 30. FIG. 4 is a layout view of the MRAM 100.

A plurality of MTJ elements 10 are provided on a front-end circuit which includes select transistors formed on a semiconductor substrate. The MTJ element 10 is configured such that a reference layer (fixed layer) 11, a tunnel barrier layer (non-magnetic layer) 12 and a memory layer (recording layer) 13 are stacked. The order of stacking of the reference layer 11 and memory layer 13 may be reversed. The planer shape of the MTJ element 10 is not particularly limited, and may be, for example, circular or elliptic.

Each of the memory layer 13 and reference layer 11 is formed of a ferromagnetic layer, and has magnetic anisotropy in a direction perpendicular to the film surface, and the direction of easy magnetization thereof is perpendicular to the film surface. Specifically, the MTJ element 10 is a perpendicular magnetization MTJ element in which the direction of magnetization of each of the memory layer 13 and reference layer 11 is perpendicular to the film surface.

The direction of magnetization of the memory layer 13 is variable (reversible). The direction of magnetization of the reference layer 11 is invariable (fixed). The reference layer 11 is designed to have a sufficiently higher perpendicular magnetic anisotropy energy than the memory layer 13. Setting of magnetic anisotropy can be made by adjusting a material composition or film thickness. In this manner, the magnetization switching current of the memory layer 13 is decreased, and the magnetization switching current of the reference layer 11 is made higher than that of the memory layer 13. Thereby, the MTJ element 10 including the memory layer 13, whose magnetization direction is variable relative to a predetermined write current, and the reference layer 11, whose magnetization direction is invariable relative to the predetermined write current, can be realized.

An interlayer insulating layer 20 is provided on the plural MTJ elements 10. A ferroelectric capacitor 30 is provided on the interlayer insulating layer 20. One ferroelectric capacitor 30 is provided for the plural MTJ elements 10, and the ferroelectric capacitor 30 is formed in a planer form in a manner to cover the plural MTJ elements 10. Incidentally, one ferroelectric capacitor 30 may be provided for all MTJ elements 10 in the MRAM, or one ferroelectric capacitor 30 may be provided for a predetermined number of MTJ elements 10, that is, for two or more MTJ elements 10.

The ferroelectric capacitor 30 is configured such that a lower electrode 31, a ferroelectric film 32 and an upper electrode 33 are stacked. For example, lead zirconate titanate [PZT: $Pb(Zr, Ti)O_3$] is used for the ferroelectric film 32.

An interlayer insulating layer 40 is provided on the ferroelectric capacitor 30. The Young's modulus of the interlayer insulating layer 40 is set to be lower than the Young's modulus of the ferroelectric film 32. For example, when the ferroelectric film 32 is formed of PZT, the Young's modulus thereof is about 100 (GPa). Thus, the interlayer insulating layer 40 is formed of a material having a Young's modulus of less than 100. Examples of the insulating material having a Young's modulus of less than 100 include silicon oxide ($SiO_2$) and an insulating film (low-k film) having a lower dielectric constant than $SiO_2$.

In the present embodiment, use is made of a spin transfer torque writing method in which a write current is caused to directly flow through the MTJ element 10 and the magnetization configuration of the MTJ element 10 is controlled by this write current. The MTJ element 10 can take either a low resistance state or a high resistance state, depending on whether the relative relationship of magnetization between the memory layer 13 and reference layer 11 is parallel or antiparallel.

If a write current in a direction from the memory layer 13 toward the reference layer 11 is caused to flow through the MTJ element 10, the relative relationship of magnetization between the memory layer 13 and reference layer 11 becomes parallel. In the case of this parallel state, the resistance value of the MTJ element 10 becomes lowest, and the MTJ element 10 is set in a low resistance state. The low resistance state of the MTJ element 10 is defined as, e.g. data "0".

On the other hand, if a write current in a direction from the reference layer 11 toward the memory layer 13 is caused to flow through the MTJ element 10, the relative relationship of magnetization between the memory layer 13 and reference layer 11 becomes antiparallel. In the case of this antiparallel state, the resistance value of the MTJ element 10 becomes highest, and the MTJ element 10 is set in a high resistance state. The high resistance state of the MTJ element 10 is defined as, e.g. data "1".

Thereby, the MTJ element 10 is usable as a memory element which can store 1-bit data (two-value data). Allocation between the resistance states of the MTJ element 10 and the data can be arbitrarily set.

When data is read from the MTJ element 10, a read voltage is applied to the MTJ element 10, and the resistance value of the MTJ element 10 is detected based on a read current which flows through the MTJ element 10 at this time. The read voltage is set at a sufficiently lower value than the threshold at which a magnetization switching process is caused by spin-transfer torque.

[3. Detailed Configuration of MRAM]

Figure 5:
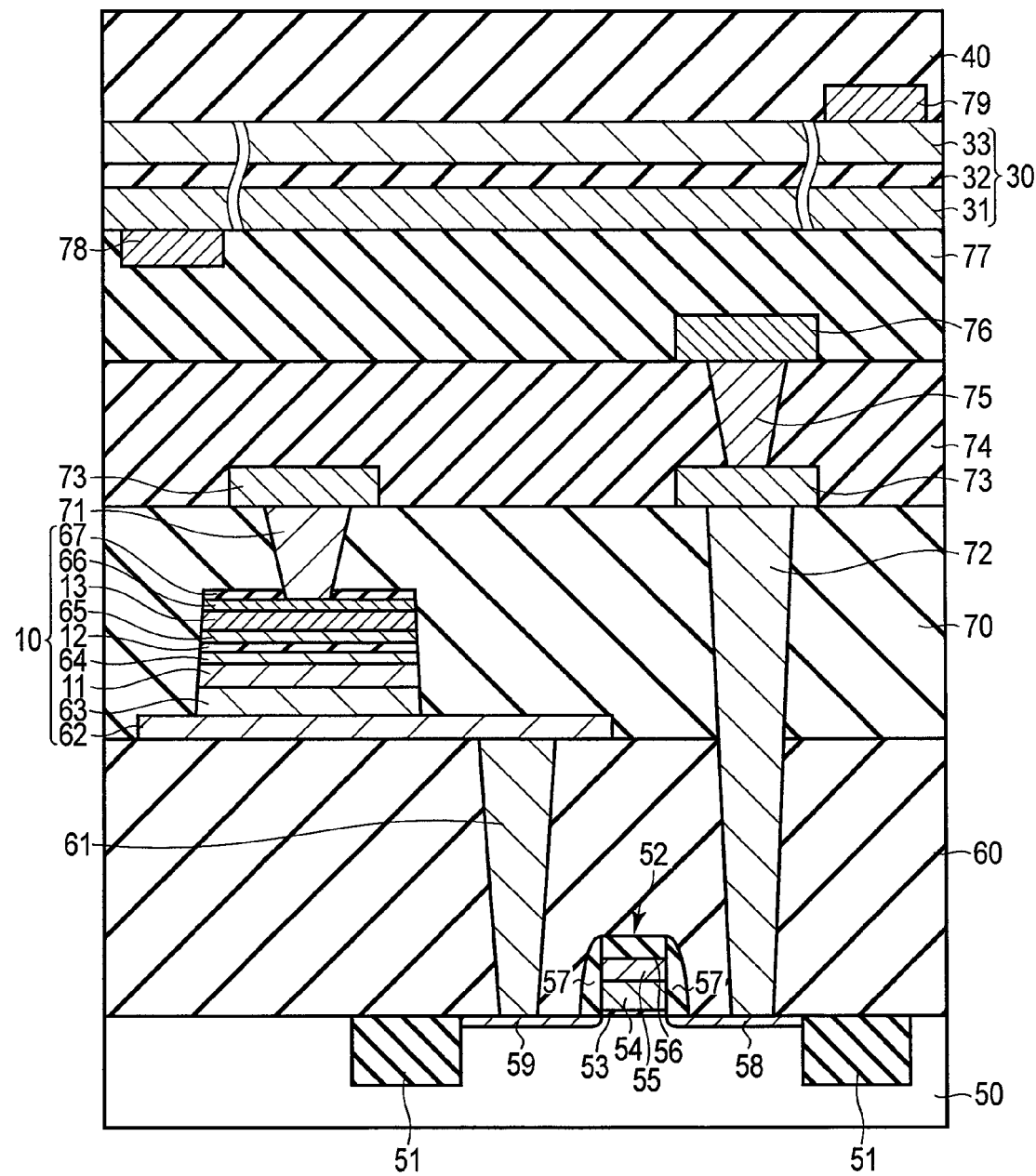
FIG. 5 is a cross-sectional view of the MRAM.

Next, the detailed configuration of the MRAM 100 is described. FIG. 5 is a cross-sectional view of the MRAM 100.

An element isolation region (STI: Shallow Trench Isolation) 51 is provided in that region of a p-type semiconductor substrate 50, which is other than a transistor active area (element region). A select transistor 52 is provided in the active area of the semiconductor substrate 50. The select transistor 52 is composed of a gate insulating film 53, a gate electrode 54, a silicide layer 55, a cap layer 56, spacer portions 57, a source region 58 and a drain region 59.

An interlayer insulating layer 60 is provided on the select transistor 52. A contact plug 61, which is electrically connected to the drain region 59 of the select transistor 52, is provided in the interlayer insulating layer 60.

A lower electrode 62 of the MTJ element 10 is provided on the contact plug 61. The MTJ element 10 is configured such that the lower electrode 62, an orientation control film 63, a reference layer 11, a highly oriented magnetic film 64, a tunnel barrier layer 12, a highly oriented magnetic film 65, a memory layer 13, an upper electrode 66 and a mask layer 67 are stacked. FIG. 5 shows, in an extracted manner, one memory cell MC (MTJ element 10 and select transistor 52). However, actually, memory cells MC each having the same structure as shown in FIG. 5 are disposed in a matrix.

An interlayer insulating layer 70 is provided on the MTJ element 10. A contact plug 71, which is electrically connected to the upper electrode 66 of the MTJ element 10, is provided in the interlayer insulating layer 70. A wiring layer 73, which is electrically connected to the bit line BL, is provided on the contact plug 61.

A contact plug 72, which is electrically connected to the source region 58 of the select transistor 52, is provided in the interlayer insulating layers 60 and 70. A wiring layer 73 is provided on the contact plug 72. An interlayer insulating layer 74 is provided on the wiring layer 73, and a contact plug 75, which is electrically connected to the wiring layer 73, is provided in the interlayer insulating layer 74. A wiring layer 76, which is electrically connected to the bit line /BL, is provided on the contact plug 75. An interlayer insulating layer 77 is provided on the wiring layer 76. In the meantime, the interlayer insulating layer 20 shown in FIG. 3 corresponds to the interlayer insulating layers 70, 74 and 77 in FIG. 5.

A ferroelectric capacitor 30 is provided on the interlayer insulating layer 77. As described above, one ferroelectric capacitor 30 is provided above a plurality of MTJ elements 10, and has such a size as to cover the plural MTJ elements 10. A wiring layer 78 is electrically connected to the lower electrode 31 of the ferroelectric capacitor 30, and a wiring layer 79 is electrically connected to the upper electrode 33 of the ferroelectric capacitor 30. The wiring layers 78 and 79 are electrically connected to the driver 150 shown in FIG. 1. An interlayer insulating layer 40, as described above, is provided on the ferroelectric capacitor 30.

(Manufacturing Method)

Next, an example of the manufacturing method of the MRAM is described.

To begin with, as illustrated in FIG. 6, a trench for element isolation is formed in that region of a p-type semiconductor substrate 50 formed of, e.g. a silicon substrate, which is other than a transistor active area. Silicon oxide ($SiO_2$), for example, is buried in the trench, and an element isolation region (STI: Shallow Trench Isolation) 51 is formed.

Then, a select transistor 52 for performing a switch operation is formed. To start with, a silicon oxide film (gate insulating film) 53 with a thickness of about 60 Å is formed by thermal oxidation over the entirety of the semiconductor substrate 50. Subsequently, an n-type polycrystalline silicon film, which is doped with n-type impurities (e.g. arsenic (As)), is formed as a gate electrode 54, and a $WSi_x$ film, for example, is formed as a silicide layer 55. Further, a nitride film, for example, is formed as a cap layer 56. Thereafter, the n-type polycrystalline silicon film 54, $WSi_x$ film 55 and nitride film 56 are processed by an ordinary photolithography method and RIE (Reactive Ion Etching) method, thereby forming a gate structure. Further, a nitride film, for example, is deposited on the gate structure, and spacer portions 57 are formed on side walls of the gate structure by a method of leaving a side wall by RIE. Subsequently, a source region 58 and a drain region 59, which are made of n-type semiconductor regions, are formed in the semiconductor substrate 50 by ion implantation and heat treatment. Thus, the select transistor 52 is formed.

Following the above, as illustrated in FIG. 7, a silicon oxide film, for example, is deposited as an interlayer insulating layer 60 by CVD (Chemical Vapor Deposition) on the entire surface of the sample. Then, the interlayer insulating layer 60 is planarized by CMP (Chemical Mechanical Polishing). Subsequently, a contact hole, which reaches the drain region 59 of the select transistor 52, is formed in the interlayer insulating layer 60, and a conductive material is buried in the contact hole, thereby forming a contact plug 61. Specifically, a thin Ti film is deposited by sputtering or CVD in the entire surface of the contact hole, and is subjected to heat treatment in a forming gas, thereby forming a TiN film (barrier film). Then, tungsten (W) is deposited in the contact hole by CVD, and the tungsten (W) on the region other than the contact hole is removed by CMP, and thus the contact plug 61 is formed.

Figure 8:
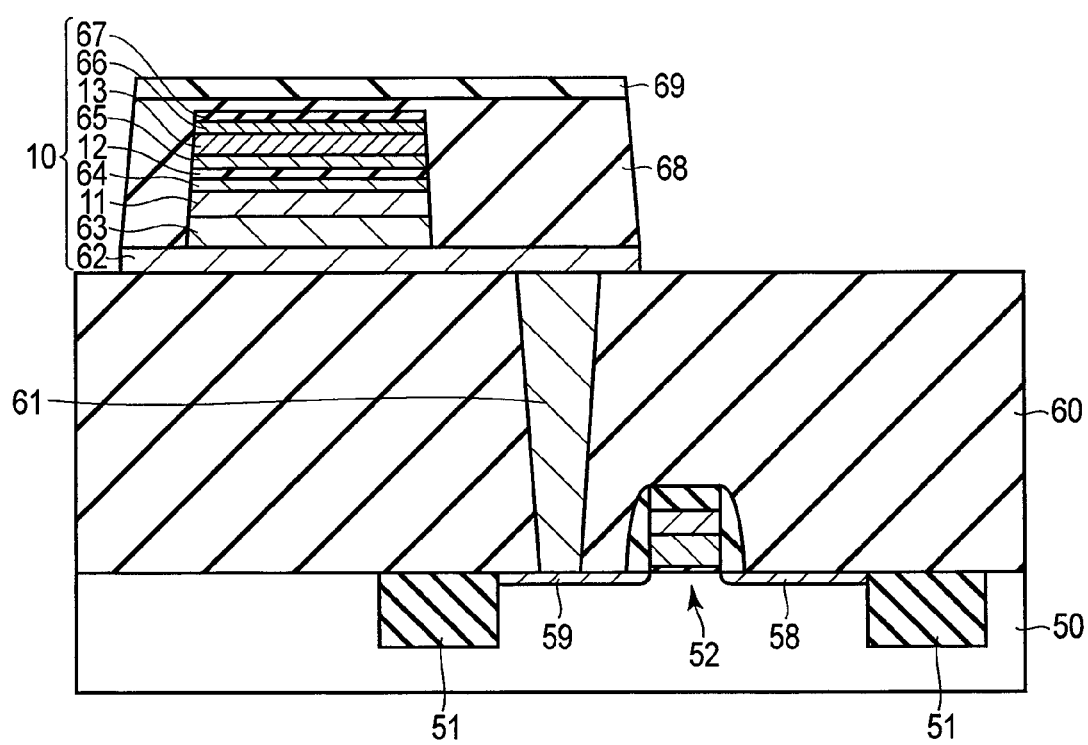
FIG. 8 is a cross-sectional view illustrating a manufacturing step of the MRAM.

Subsequently, as illustrated in FIG. 8, tantalum (Ta) as a lower electrode 62 of the MTJ element 10 is formed with a thickness of about 5 nm on the contact plug 61. Then, platinum (Pt) with a thickness of about 5 nm is formed as an orientation control film 63 on the lower electrode 62. The orientation control film 63 is oriented in the (001) plane. Then, a perpendicular magnetic film, which is made of $Fe_{50}Pt_{50}$ with a thickness of about 50 nm is formed as a reference layer 11 on the orientation control film 63. Subsequently, $Co_{40}Fe_{40}B_{20}$ with a thickness of about 1 nm is formed as a highly oriented magnetic film 64 on the reference layer 11. Then, magnesium oxide (MgO) with a thickness of about 1 nm is formed as a tunnel barrier layer 12 on the highly oriented magnetic film 64.

Following the above, $Co_{40}Fe_{40}B_{20}$ with a thickness of about 1 nm is formed as a highly oriented magnetic film 65 on the tunnel barrier layer 12. Then, a multilayer film [Co/Pt] 5, which becomes a perpendicular magnetic film with a lamination of 5 cycles each comprising Co with a thickness of about 0.4 nm and Pt with a thickness of about 0.8 nm, is formed as a memory layer 13 on the highly oriented magnetic film 65. Subsequently, tantalum (Ta) with a thickness of about 10 nm is formed as an upper electrode 66 on the memory layer 13. All the films 62 to 66 and 11 to 13, which constitute the above-described MTJ film, are formed by using a sputtering method.

Subsequently, crystallization anneal of MgO is performed in a vacuum at 360° C. for one hour. By this anneal, the MgO is crystallized, and the CoFeB as the highly oriented magnetic film 64 and 65 is also crystallized.

Then, a silicon oxide film, for example, is deposited by CVD as a mask layer 67 for processing, and the silicon oxide film 67 is patterned by photolithography and RIE. Subsequently, the upper electrode 66, memory layer 13, highly oriented magnetic film 65, tunnel barrier layer 12, highly oriented magnetic film 64, reference layer 11 and orientation control film 63 are etched by RIE.

Following the above, after a silicon oxide film 68 is deposited on the entire surface of the sample, a silicon nitride film 69 as a hard mask, is deposited and the silicon nitride film 69 is patterned by photolithography and RIE. Then, the silicon oxide film 68 and lower electrode 62 are etched by RIE. Thus, the processing of the MTJ element 10 is completed.

Figure 9:
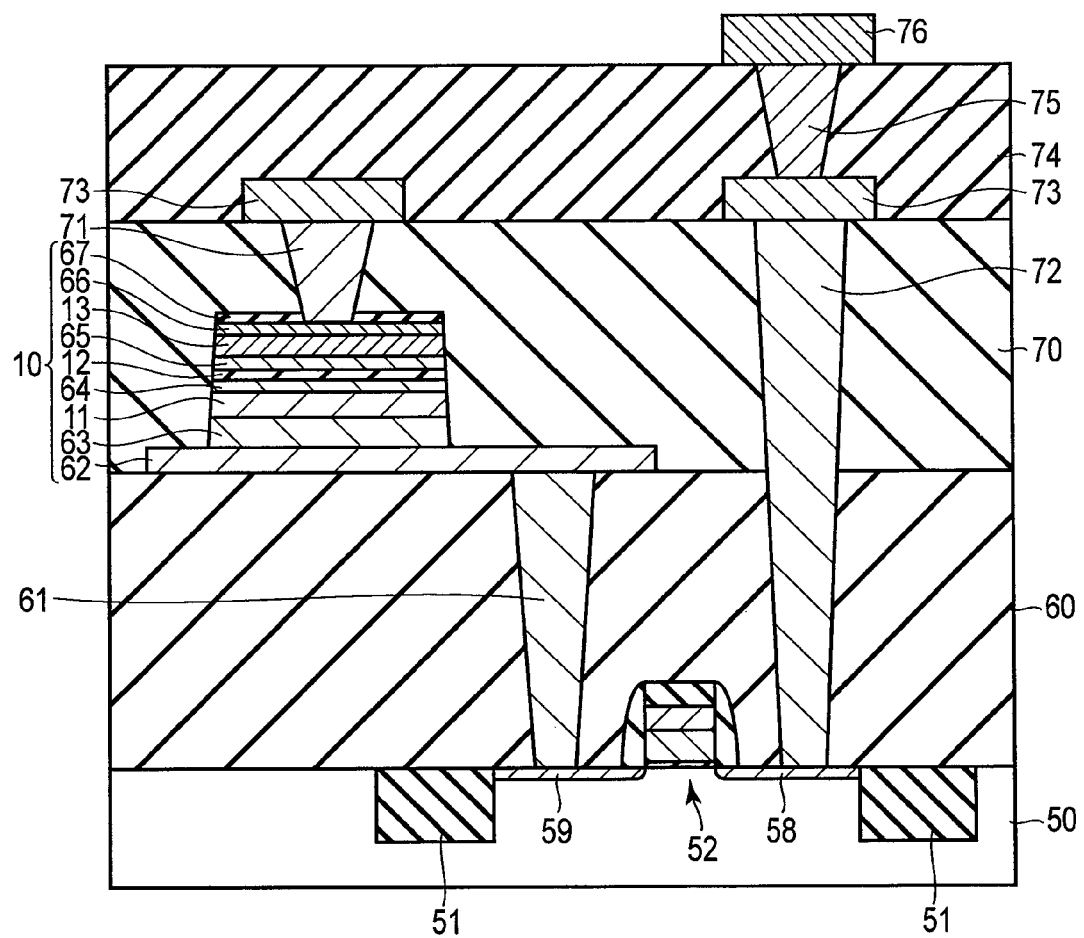
FIG. 9 is a cross-sectional view illustrating a manufacturing step of the MRAM.

Next, as illustrated in FIG. 9, a silicon oxide film, for example, is formed by CVD as an interlayer insulating layer 70. As conditions for forming the silicon oxide film 70, TEOS and $O_2$ are used as a material, and an RF (radio frequency) plasma is applied at a substrate temperature of 350° C.

After a contact hole, which reaches the upper electrode 66 of the MTJ element 10, is formed in the interlayer insulating layer 70, a conductive material is buried in this contact hole, thereby forming a contact plug 71. In addition, a contact hole, which reaches the source region 58 of the select transistor 52, is formed in the interlayer insulating layers 60 and 70, and a conductive material is buried in this contact hole, thereby forming a contact plug 72. Each of the contact plugs 71 and 72 is formed by forming a thin multilayer film (barrier film), which is composed of a Ti film and a TiN film, in the entire surface of the contact hole, and then burying tungsten (W) in the contact hole. TiN was formed by using CVD at a film formation temperature of 350° C., with $TiCl_4$ and $NH_3$ used as a material gas. In addition, tungsten (W) was formed by using CVD, with $WF_6$ used as a material.

Subsequently, after the interlayer insulating layer 70 and contact plugs 71 and 72 are planarized by CMP, an interlayer film (silicon oxide film) is deposited and a wiring trench is formed by photolithography and RIE. Then, aluminum (Al), for example, is buried in the wiring trench and planarized by CMP, and wiring layers 73 are formed on the contact plugs 71 and 72. After an interlayer insulating layer 74 is deposited, a via plug 75, which is electrically connected to the source region 58 of the select transistor 52, and a wiring layer 76 are formed by the above similar processes.

Following the above, as illustrated in FIG. 5, a silicon oxide film, for example, is formed by CVD as an interlayer insulating layer 77 on the entire surface of the sample. Then, a wiring layer 78, which is formed of, e.g. aluminum (Al) and is electrically connected to the lower electrode 31 of the ferroelectric capacitor 30, is formed in the interlayer insulating layer 77.

Subsequently, a ruthenium (Ru) film, for example, as a lower electrode 31 of the ferroelectric capacitor 30, a $BiTiO_3$ film, for example, as a ferroelectric film 32, and a ruthenium (Ru) film, for example, as an upper electrode 33 are successively formed on the wiring layer 78 and interlayer insulating layer 77, and then anneal is performed to crystallize the ferroelectric film 32. A flash lamp anneal method was used as the crystallization anneal. Thereby, the ferroelectric film 32 can be crystallized, while a thermal load on the MTJ element 10 is reduced. All the films 31 to 33, which constitute the ferroelectric capacitor 30, were formed by using a sputtering method. Thereafter, the ferroelectric capacitor 30 is patterned by photolithography and RIE.

Then, a wiring layer 79, which is formed of, e.g. aluminum (Al) and is electrically connected to the upper electrode 33 of the ferroelectric capacitor 30, is formed. Subsequently, an interlayer insulating layer 40 is formed on the ferroelectric capacitor 30. As described above, a material having a Young's modulus, which is lower than the Young's modulus of the ferroelectric film 32, is used for the interlayer insulating layer 40. Then, although not illustrated, upper wiring layers are successively formed, and the MRAM is completed.

The above-described various materials are merely examples, and other materials may be used.

Aside from the above-described PZT and BiTiO-based ($BiTiO_3$) materials, such materials as a BiSiO-based material, SrTaNbO-based material, SrBiTaO-based material, or a BiLaTiO-based material may be used for the ferroelectric film 32.

Aside from the above-described $Fe_{50}Pt_{50}$, a perpendicular magnetic film of, e.g. $Co_{50}Pt_{50}$ or $Co_{30}Fe_{20}Pt_{50}$ may be used as the reference layer 11. Furthermore, $(Fe_{50}Pt_{50})_{88}$—$(SiO_2)_{12}$, for example, which has a composition in which the above-mentioned composition is divided by $SiO_2$, MgO, or the like, may be used for the reference layer 11.

As the memory layer 13, a Co/Pd multilayer film may be used in place of a Co/Pt multilayer film, and the number of cycles of lamination may be varied in a range of 1 to 10 in accordance with characteristics. In addition, an alloy consisting of cobalt (Co) and platinum (Pt) may be used.

Although platinum (Pt) was used as the orientation control film 63, iridium (Ir), ruthenium (Ru), or a multilayer film thereof may be used.

Besides, the order of lamination of the MTJ film may be reversed. In this case, the MTJ element 10 has, for example, the following multilayer structure.

Tantalum (Ta) with a thickness of about 5 nm is formed as a lower electrode 62, and then platinum (Pt) with a thickness of about 5 nm is formed as an orientation control film 63. The orientation control film 63 is oriented in the (001) plane. Then, a multilayer film [Co/Pt] 5, which is a perpendicular magnetic film with a lamination of 5 cycles each comprising cobalt (Co) with a thickness of about 0.4 nm and platinum (Pt) with a thickness of about 0.8 nm, is formed as a memory layer 13. Subsequently, $Co_{40}Fe_{40}B_{20}$ with a thickness of about 1 nm is formed as a highly oriented magnetic film 64. Then, after magnesium oxide (MgO) with a thickness of about 1.0 nm is formed as a tunnel barrier layer 12, $Co_{40}Fe_{40}B_{20}$ with a thickness of about 1 nm is formed as a highly oriented magnetic film 65. Subsequently, a perpendicular magnetic film, which is made of $Fe_{50}Pt_{50}$ with a thickness of about 10 nm is formed as a reference layer 11, and then tantalum (Ta) with a thickness of about 10 nm is formed as an upper electrode 66. All the films 62 to 66 and 11 to 13, which constitute the above-described MTJ film, were formed by using a sputtering method.

Besides, in order to fix magnetization of the reference layer 11 in one direction, an antiferromagnetic layer may be provided adjacently. As the antiferromagnetic layer, use may be made of an alloy of manganese (Mn), and iron (Fe), nickel (Ni), platinum (Pt), palladium (Pd), ruthenium (Ru), osmium (Os) or iridium (Ir), namely, Fe—Mn, Ni—Mn, Pt—Mn, Pd—Mn, Ru—Mn, Os—Mn, or Ir—Mn. Furthermore, Cr—Pt—Mn, for example, may be used as the antiferromagnetic layer.

[3. Operation of MRAM]

Next, the operation of the MRAM 100 having the above-described structure is described.

Figure 10:
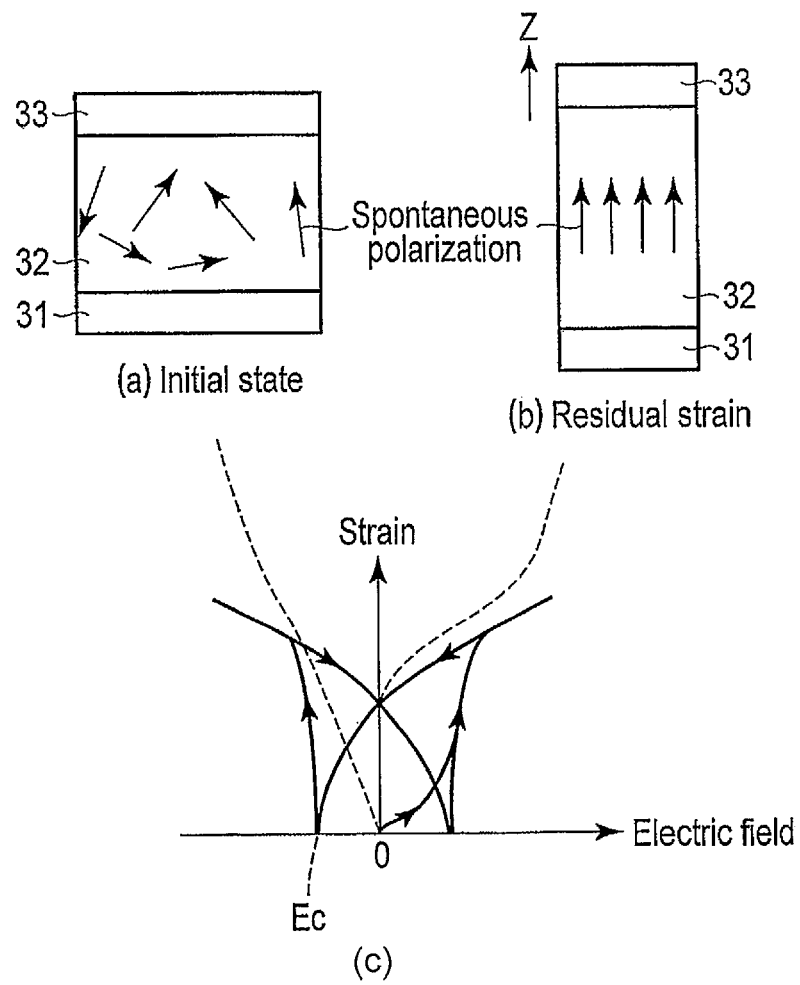
FIG. 10 is a graph illustrating a relationship between an electric field and a strain induced the electric field of a ferroelectric capacitor.

Part (c) of FIG. 10 is a graph illustrating a relationship between an electric field and a strain induced by the electric field of the ferroelectric capacitor 30. In part (c) of FIG. 10, the abscissa indicates an electric field, and the ordinate indicates a strain induced by the electric field.

Part (a) of FIG. 10 shows an initial state (pre-polarization) in which no initial voltage is applied to the ferroelectric film 32. In the initial state, the ferroelectric film 32 has a random spontaneous polarization, and the strain at this time is substantially zero. If an electric field is applied to the ferroelectric film 32 via the lower electrode 31 and upper electrode 33, such a strain occurs that the ferroelectric film 32 extends in a direction (z direction) perpendicular to the film surface, as illustrated in part (b) of FIG. 10. As illustrated in part (c) of FIG. 10 the strain of the ferroelectric film 32 varies in a hysteresis loop, and the strain remains even after the electric field is reduced to zero ("residual strain"). Further, if a coercive electric field Ec is applied to the ferroelectric film 32 via the lower electrode 31 and upper electrode 33, the strain of the ferroelectric film 32 becomes substantially zero. In the meantime, FIG. 10 shows a variation (absolute value) from the state in which the strain of the ferroelectric film 32 is zero.

FIG. 11 is a schematic view illustrating a relationship between a stress, which is applied to the MTJ element 10, and characteristics of the MTJ element 10. Incidentally, the ferroelectric film 32 is in a state in which a residual stress occurs.

As illustrated in part (a) of FIG. 11, if the potential difference V between the lower electrode 31 and upper electrode 33 is set at V=0 and the electric field applied to the ferroelectric film 32 is set at zero, the ferroelectric film 32 is in a state in which a residual strain occurs. At this time, since the interlayer insulating layer 40 having a lower Young's modulus than the ferroelectric film 32 is provided on the ferroelectric capacitor 30, such a strain as to extend upward occurs in the ferroelectric film 32. Thus, a compressive stress in the in-plane direction occurs in the ferroelectric film 32, and this compressive stress also acts on the MTJ element 10 via the interlayer insulating layer 20.

In addition, as illustrated in part (b) of FIG. 11, if the potential difference V between the lower electrode 31 and upper electrode 33 is set at V≈Vc (coercive voltage) to apply a coercive electric field Ec to the ferroelectric film 32, the strain of the ferroelectric film 32 decreases (e.g. substantially zero). Thereby, the compressive stress in the in-plane direction, which is applied to the MTJ element 10, decreases.

The variation in resistance of the MTJ element 10 is determined by a tunnel current which flows through the tunnel barrier layer 12 in accordance with the magnetization configuration of the reference layer 11 and memory layer 13. In particular, since an MTJ film, which is composed of CoFeB/MgO/CoFeB, can achieve a high MR ratio and a low switching current, CoFeB (highly oriented magnetic films 64 and 65) is used together with a perpendicular magnetization film. The perpendicular magnetic anisotropy of CoFeB occurs because a compressive stress in the in-plane direction acts on the CoFeB by an interface stress with the MgO. A high perpendicular magnetic anisotropy is necessary in order to obtain thermal stability relating to data retention characteristics. On the other hand, if the perpendicular magnetic anisotropy is increased, a thermal magnetization switching process becomes difficult to occur, and also a magnetization switching process by spin-transfer torque becomes difficult to occur. Hence, a write current increases.

As described above, since the perpendicular magnetic anisotropy occurs due to the compressive stress acting on the CoFeB (highly oriented magnetic films 64 and 65), the perpendicular magnetic anisotropy increases if the compressive stress increases, and the perpendicular magnetic anisotropy can be decreased if the compressive stress is decreased. Since the ferroelectric film 32 has a high electrostriction characteristic, the stress which occurs in the vicinity can be arbitrarily varied by varying the voltage which is applied to the ferroelectric capacitor 30.

Specifically, as illustrated in part (b) of FIG. 11, if the ferroelectric capacitor 30 is disposed above the MTJ element 10 and a voltage (coercive voltage) is applied to the ferroelectric capacitor 30 so that the strain (residual strain) of the ferroelectric film 32 may decrease (i.e. the thickness of the ferroelectric film 32 may decrease) at a time of data write, such a stress occurs that the ferroelectric film 32 extends in the in-plane direction, according to the Poisson's ratio. Thus, a tensile stress in the in-plane direction also acts, via the interlayer insulating layer, on the MTJ element 10 which is disposed in the vicinity of the ferroelectric capacitor 30, the perpendicular magnetic anisotropy of the memory layer 13 decreases, and a write current can be reduced. This method, in which a write current is reduced by applying a stress to the MTJ element 10 from the outside, is called "SAS (Stress Assist Switching) method". In particular, in the present embodiment, since the stress, which is applied to the MTJ element 10, can be varied by varying the voltage that is applied to the ferroelectric film 32, a variable stress assist-type semiconductor memory device is realized. For example, in the case where the thickness of the ferroelectric film 32 is set at about 20 nm, if a voltage of 2 V is applied to the ferroelectric capacitor 30, the current (write current) which switches magnetization of the memory layer 13 decrease to about ½, compared to the case of 0 V.

In addition, as illustrated in part (a) of FIG. 11, after the formation of the ferroelectric capacitor 30, the crystalline direction of the ferroelectric capacitor 30 is random before an initial voltage is applied, but if a voltage is once applied to the ferroelectric capacitor 30, the polarization axis is directed to the film thickness direction, that is, the ferroelectric film 32 extends in the film thickness direction. Even after the application of voltage is stopped, the extension in the film thickness direction by the residual strain is kept. The extension in the film thickness direction means that the compressive stress acts in the in-plane direction, from the relationship of the Poisson's ratio, and the compressive stress also acts on the CoFeB. Thus, the perpendicular magnetic anisotropy of the reference layer 11 and memory layer 13 can be increased. Thereby, the data retention characteristic of the MTJ element 10 is improved.

Next, a write operation and a data retention operation will be specifically described.

In a write operation, a compressive stress in an in-plane direction, which is applied to the MTJ element 10, is decreased, and the perpendicular magnetic anisotropy of the memory layer 13 is reduced. For this purpose, before writing data in the MTJ element 10 (i.e. before supplying a write current to the MTJ element 10), the driver 150 applies a potential difference V≈Vc (coercive voltage) between the lower electrode 31 and upper electrode 33 of the ferroelectric capacitor 30. Thereby, the compressive stress in the in-plane direction, which is applied to the MTJ element 10, decreases. Subsequently, the controller 170 supplies a write current to the MTJ element 10. As a result, since the perpendicular magnetic anisotropy of the memory layer 13 is lower than in a normal time (data retention time), the write current can be reduced.

In a data retention operation other than a write operation, the compressive stress in the in-plane direction, which is applied to the MTJ element 10, is increased, and the perpendicular magnetic anisotropy of the reference layer 11 and memory layer 13 is increased. Thus, in the data retention operation of the MTJ element 10, the driver 150 applies a potential difference V=0 between the lower electrode 31 and upper electrode 33 of the ferroelectric capacitor 30. Thereby, due to the residual strain of the ferroelectric film 32, the compressive stress in the in-plane direction, which is applied to the MTJ element 10, increases. As a result, since the perpendicular magnetic anisotropy of the reference layer 11 and memory layer 13 becomes higher than in the case where the compressive stress is zero, the data retention characteristic is improved.

In the meantime, at the time of the write operation of a selected MTJ element that is a target of data write, the compressive stress, which is applied to a non-selected MTJ element that is not a target of data write, also decreases. However, since the time that is needed for one-time write operation is short, the influence on the data retention operation is small.

[4. Advantageous Effects]

As has been described above in detail, in the first embodiment, at a time of data write, the write current is reduced by applying to the MTJ element 10 a stress by a strain of the ferroelectric capacitor 30. In addition, at a time of data retention, the stress that is applied to the MTJ element 10 is reduced by decreasing the strain of the ferroelectric capacitor 30, and the data retention characteristic of the MTJ element 10 is improved. Thereby, the write current can be reduced while a high data retention characteristic is maintained, and an MRAM having good characteristics can be realized.

In addition, if the planarity of the magnetic layer and non-magnetic layer deteriorates, the magnetic characteristic of the MTJ element 10 would deteriorate. Thus, it is desirable to improve the planarity (i.e. to reduce roughness). For example, when the ferroelectric capacitor is disposed under the MTJ element, the planarity of the MTJ element deteriorates due to the roughness of the upper surface of the ferroelectric capacitor, and the magnetic characteristic of the MTJ element deteriorates. As regards this, in the present embodiment, the ferroelectric capacitor 30 is disposed above the MTJ element 10. Thus, the planarity of each layer of the MTJ element 10 can be made higher, without being affected by the ferroelectric capacitor 30. Thereby, even in the case where the ferroelectric capacitor 30 is disposed near the MTJ element 10, the magnetic characteristic of the MTJ element 10 can be prevented from deteriorating.

Second Embodiment

A second embodiment relates to an example of an MTJ element using a ferromagnetic layer with in-plane magnetization.

The entire structure of an MRAM 100 according to the second embodiment is the same as the structure shown in FIG. 1, and the multilayer structure of an MTJ element 10 is the same as that shown in FIG. 5.

Each of a memory layer 13 and a reference layer 11 is composed of a ferromagnetic layer, has a magnetic anisotropy in an in-plane direction, and the direction of easy magnetization thereof is an in-plane direction. Specifically, the MTJ element 10 is an in-plane magnetization MTJ element in which the direction of magnetization of each of the memory layer 13 and reference layer 11 is an in-plane direction.

An interlayer insulating layer 40 is provided on the ferroelectric capacitor 30. The Young's modulus of the interlayer insulating layer 40 is set to be equal to or higher than the Young's modulus of the ferroelectric film 32. For example, when the ferroelectric film 32 is formed of PZT, the Young's modulus thereof is about 100 (GPa). Thus, the interlayer insulating layer 40 is formed of a material having a Young's modulus of about 100 or more. Examples of the insulating material with the Young's modulus of 100 or more include aluminum oxide ($Al_2O_3$), silicon nitride (SiN) and aluminum nitride (AlN).

FIG. 12 is a schematic view illustrating a relationship between a stress, which is applied to the MTJ element 10 according to the second embodiment, and characteristics of the MTJ element 10. Incidentally, the ferroelectric film 32 is in a state in which a residual stress occurs.

As illustrated in part (a) of FIG. 12, if the potential difference V between the lower electrode 31 and upper electrode 33 is set at V=0 and the electric field applied to the ferroelectric film 32 is set at zero, the ferroelectric film 32 is in a state in which a residual strain occurs. At this time, since the interlayer insulating layer 40 having a Young's modulus which is equal to or higher than the Young's modulus of the ferroelectric film 32 is provided on the ferroelectric capacitor 30, such a strain as to extend downward occurs in the ferroelectric film 32. Thus, the ferroelectric capacitor 30 applies a stress in a manner to press the MTJ element 10 from above. Thereby, a tensile stress in the in-plane direction acts in the MTJ element 10. In the case of the in-plane magnetization MTJ element 10, if a tensile stress acts at the interface of the tunnel barrier layer 12, the in-plane magnetic anisotropy of the reference layer 11 and memory layer 13 increases. Hence, a thermal magnetization switching process becomes difficult to occur, and also a magnetization switching process by spin-transfer torque becomes difficult to occur. Therefore, the data retention characteristic is improved.

On the other hand, as illustrated in part (b) of FIG. 12, if the potential difference V between the lower electrode 31 and upper electrode 33 is set at V≈Vc (coercive voltage) to apply a coercive electric field Ec to the ferroelectric film 32, the strain of the ferroelectric film 32 decreases. Thereby, the tensile stress in the in-plane direction, which is applied to the MTJ element 10, decreases. In the case of the in-plane magnetization MTJ element 10, if the tensile stress in the in-plane direction, which is applied to the MTJ element 10, decreases (or if the compressive stress in the in-plane direction increases), the in-plane magnetic anisotropy of the memory layer 13 decreases, and the write current can be reduced.

Next, a write operation and a data retention operation will be specifically described.

In a write operation, a tensile stress in an in-plane direction, which is applied to the MTJ element 10, is decreased, and the in-plane magnetic anisotropy of the memory layer 13 is reduced. For this purpose, before writing data to the MTJ element 10 (i.e. before supplying a write current to the MTJ element 10), the driver 150 applies a potential difference V≈Vc (coercive voltage) between the lower electrode 31 and upper electrode 33 of the ferroelectric capacitor 30. Thereby, the tensile stress in the in-plane direction, which is applied to the MTJ element 10, decreases. Subsequently, the controller 170 supplies a write current to the MTJ element 10. As a result, since the in-plane magnetic anisotropy of the memory layer 13 is lower than in a normal time (data retention time), the write current can be reduced.

In a data retention operation other than a write operation, the tensile stress in the in-plane direction, which is applied to the MTJ element 10, is increased, and the in-plane magnetic anisotropy of the reference layer 11 and memory layer 13 is increased. Thus, in the data retention operation of the MTJ element 10, the driver 150 applies a potential difference V=0 between the lower electrode 31 and upper electrode 33 of the ferroelectric capacitor 30. Thereby, the tensile stress in the in-plane direction, which is applied to the MTJ element 10, increases. As a result, since the in-plane magnetic anisotropy of the reference layer 11 and memory layer 13 becomes higher than in the case where the tensile stress is zero, the data retention characteristic is improved.

Advantageous Effects

As has been described above in detail, according to the second embodiment, even in the case where the in-plane magnetization MTJ element is used as the memory element of the MRAM, the write current can be reduced while a high data retention characteristic is maintained, as in the first embodiment, and an MRAM having good characteristics can be realized.

Third Embodiment

In a third embodiment, the MTJ element 10 is covered with a ferroelectric layer, and a stress is applied to the MTJ element 10 by controlling a voltage of this ferroelectric layer.

Figure 13:
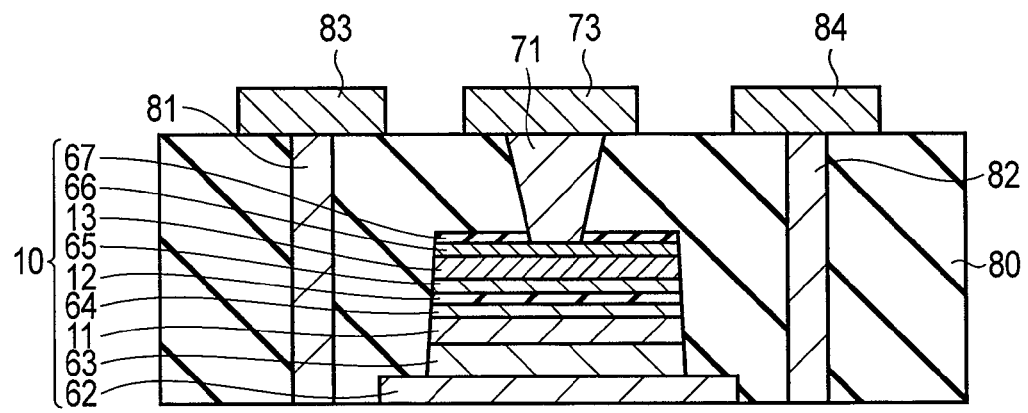
FIG. 13 is a cross-sectional view of an MRAM according to a third embodiment.
Figure 14:
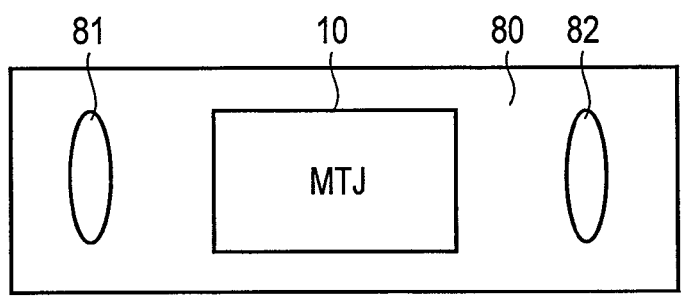
FIG. 14 is a plan view of the MRAM shown in FIG. 13.

FIG. 13 is a cross-sectional view of an MRAM 100 according to the third embodiment. FIG. 14 is a plan view of the MRAM 100 shown in FIG. 13. Incidentally, the structure below the lower electrode 62 of the MTJ element 10 is the same as shown in FIG. 5. The MTJ element of the third embodiment is, for example, a perpendicular magnetization MTJ element.

A ferroelectric layer 80 is provided on a top surface and a side surface (circumferential surface) of the MTJ element 10. In other words, the top surface and side surface of the MTJ element 10 are covered with the ferroelectric layer 80. The materials exemplified in the first embodiment are used for the ferroelectric layer 80.

In the ferroelectric layer 80, an electrode pair 81 and 82 is provided in a manner to sandwich the MTJ element 10. Tungsten (W), for example, is used for the electrode pair 81 and 82. Wiring layers 83 and 84 are provided on the electrodes 81 and 82. The wiring layers 83 and 84 are electrically connected to the driver 150. In the meantime, the electrode pair 81 and 82 may be provided for each of MTJ elements 10, or a single electrode pair may be provided for a plurality of MTJ elements 10. The other structure is the same as in the first embodiment.

In an example of the manufacturing method, after the MTJ element 10 is formed like the first embodiment, a BiTiO$_3$ film, for example, is deposited as a ferroelectric layer 80 by sputtering on the entire surface of the sample. Then, anneal is performed to crystallize the ferroelectric layer 80. Subsequently, electrode holes are formed by, e.g. RIE, and tungsten (W) is buried in the electrode holes by, e.g. CVD, thereby forming an electrode pair 81 and 82. Further, wiring layers 83 and 84, which are made of, e.g. aluminum (Al), are formed on the paired electrodes 81 and 82.

The operation of the MRAM 100 having the above-described structure is described.

After the formation of the ferroelectric layer 80, the crystalline direction of the ferroelectric layer 80 is random before an initial voltage is applied, but if a voltage is once applied to the ferroelectric layer 80 via the electrode pair 81 and 82, the crystalline direction extends in the inter-electrode direction (the direction from the electrode 81 to electrode 82). Even after the application of voltage is stopped, the extension in the inter-electrode direction by the residual strain is kept. Thereby, a compressive stress in the in-plane direction acts in the MTJ element 10, and a tensile stress acts in the film thickness direction (perpendicular direction). Thus, since the compressive stress also acts on the CoFeB (highly oriented magnetic films 64 and 65), the perpendicular magnetic anisotropy of the reference layer 11 and memory layer 13 can be increased. As a result, the data retention characteristic of the MTJ element 10 is improved.

In addition, at a time of data write, a voltage (coercive voltage) is applied to the ferroelectric layer 80 via the electrode pair 81 and 82 so that the strain (residual strain) of the ferroelectric layer 80 may decrease. Thereby, since the compressive stress which is applied to the CoFeB (highly oriented magnetic films 64 and 65) decreases, the perpendicular magnetic anisotropy of the reference layer 11 and memory layer 13 decreases. As a result, the write current can be reduced.

Next, a write operation and a data retention operation will be specifically described.

In a write operation, a compressive stress in an in-plane direction (inter-electrode direction), which is applied to the MTJ element 10, is decreased (the tensile stress is increased), and the perpendicular magnetic anisotropy of the memory layer 13 is reduced. For this purpose, before writing data in the MTJ element 10 (i.e. before supplying a write current to the MTJ element 10), the driver 150 applies a potential difference V≈Vc (coercive voltage) between the electrodes 81 and 82 of the ferroelectric layer 80. Thereby, the compressive stress in the in-plane direction, which is applied to the MTJ element 10, decreases. Subsequently, the controller 170 supplies a write current to the MTJ element 10. As a result, since the perpendicular magnetic anisotropy of the memory layer 13 is lower than in a normal time (data retention time), the write current can be reduced.

In a data retention operation other than a write operation, the compressive stress in the in-plane direction, which is applied to the MTJ element 10, is increased, and the perpendicular magnetic anisotropy of the reference layer 11 and memory layer 13 is increased. Thus, in the data retention operation of the MTJ element 10, the driver 150 applies a potential difference V=0 between the electrodes 81 and 82 of the ferroelectric layer 80. Thereby, due to the residual strain of the ferroelectric layer 80, the compressive stress in the in-plane direction, which is applied to the MTJ element 10, increases. As a result, since the perpendicular magnetic anisotropy of the reference layer 11 and memory layer 13 becomes higher than in the case where the compressive stress is zero, the data retention characteristic is improved.

As has been described above in detail, according to the third embodiment, like the first embodiment, the write current can be reduced by decreasing the perpendicular magnetic anisotropy only at a time of data write, while a high data retention characteristic is maintained.

In addition, in the third embodiment, since the MTJ element 10 is buried in the ferroelectric layer 80, a higher stress can be applied to the MTJ element 10.

Incidentally, the third embodiment is applicable not only to the perpendicular magnetization MTJ element, but also to the in-plane magnetization MTJ element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
magnetoresistive effect elements each including a first magnetic layer, a tunnel barrier layer, and a second magnetic layer which are successively stacked; and
a ferroelectric capacitor provided above the magnetoresistive effect elements via an insulating layer, and including a lower electrode, a ferroelectric film, and an upper electrode which are successively stacked.

2. The magnetic memory of claim 1, wherein each of the first magnetic layer and the second magnetic layer has a magnetic anisotropy in a perpendicular direction to a film surface.

3. The magnetic memory of claim 2, further comprising an insulating layer provided on the ferroelectric capacitor and having a Young's modulus which is lower than a Young's modulus of the ferroelectric film.

4. The magnetic memory of claim 1, wherein each of the first magnetic layer and the second magnetic layer includes an alloy containing cobalt (Co) and iron (Fe).

5. The magnetic memory of claim 1, wherein the tunnel barrier layer includes magnesium oxide (MgO).

6. The magnetic memory of claim 1, wherein a voltage, which is applied between the lower electrode and the upper electrode, is different between a case in which data is written to the magnetoresistive effect element and a case in which the magnetoresistive effect element retains data.

7. The magnetic memory of claim 2, wherein a voltage is applied between the lower electrode and the upper electrode such that a strain in the perpendicular direction of the ferroelectric film decreases when data is written to the magnetoresistive effect element.

8. The magnetic memory of claim 2, wherein a voltage is applied between the lower electrode and the upper electrode such that a strain in the perpendicular direction of the ferroelectric film increases when the magnetoresistive effect element retains data.

9. The magnetic memory of claim 1, further comprising a driver electrically connected to the upper electrode and the lower electrode and configured to apply a voltage between the upper electrode and the lower electrode.

10. The magnetic memory of claim 1, further comprising select transistors formed on a semiconductor substrate,
wherein one end of a current path of each of the select transistors is electrically connected to one end of each of the magnetoresistive effect elements.

11. The magnetic memory of claim 1, wherein each of the first magnetic layer and the second magnetic layer has a magnetic anisotropy in an in-plane direction.

12. The magnetic memory of claim 11, further comprising an insulating layer provided on the ferroelectric capacitor and having a Young's modulus which is equal to or higher than a Young's modulus of the ferroelectric film.

13. A magnetic memory comprising:
a magnetoresistive effect element including a first magnetic layer, a tunnel barrier layer, and a second magnetic layer which are successively stacked;
a ferroelectric layer covering a top surface and a side surface of the magnetoresistive effect element; and
a first electrode and a second electrode provided in the ferroelectric layer in a manner to sandwich the magnetoresistive effect element from both sides.

14. The magnetic memory of claim 13, wherein each of the first magnetic layer and the second magnetic layer has a magnetic anisotropy in a perpendicular direction to a film surface.

15. The magnetic memory of claim 13, wherein each of the first magnetic layer and the second magnetic layer includes an alloy containing cobalt (Co) and iron (Fe).

16. The magnetic memory of claim 13, wherein the tunnel barrier layer includes magnesium oxide (MgO).

17. The magnetic memory of claim 13, wherein a voltage, which is applied between the first electrode and the second electrode, is different between a case in which data is written to the magnetoresistive effect element and a case in which the magnetoresistive effect element retains data.

18. The magnetic memory of claim 14, wherein a voltage is applied between the first electrode and the second electrode such that a strain in an in-plane direction of the ferroelectric layer decreases when data is written to the magnetoresistive effect element.

19. The magnetic memory of claim 14, wherein a voltage is applied between the first electrode and the second electrode such that a strain in an in-plane direction of the ferroelectric layer increases when the magnetoresistive effect element retains data.

20. The magnetic memory of claim 13, further comprising a driver electrically connected to the first electrode and the second electrode and configured to apply a voltage between the first electrode and the second electrode.

21. The magnetic memory of claim 13, wherein the ferroelectric layer comprises PZT [Pb(Zr, Ti)$O_3$], a BiTiO-based material, a BiSiO-based material, an SrTaNbO-based material, an SrBiTaO-based material, or a BiLaTiO-based material.

* * * * *